United States Patent
Ahmed et al.

(10) Patent No.: US 10,811,547 B2
(45) Date of Patent: Oct. 20, 2020

(54) OHMIC CONTACT OF THIN FILM SOLAR CELL

(71) Applicant: International Business Machines Corporation, Armonk, NY (US)

(72) Inventors: Shafaat Ahmed, Yorktown Heights, NY (US); Hariklia Deligianni, Tenafly, NJ (US); Lubomyr T. Romankiw, Briancliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 15/262,760

(22) Filed: Sep. 12, 2016

(65) Prior Publication Data

US 2016/0380135 A1 Dec. 29, 2016

Related U.S. Application Data

(60) Division of application No. 13/571,806, filed on Aug. 10, 2012, now abandoned, which is a continuation of
(Continued)

(51) Int. Cl.
*H01L 31/0224* (2006.01)
*H01L 31/032* (2006.01)
(Continued)

(52) U.S. Cl.
CPC ........ *H01L 31/022441* (2013.01); *H01L 31/022425* (2013.01); *H01L 31/032* (2013.01);
(Continued)

(58) Field of Classification Search
CPC . H01L 31/0445; H01L 31/046; H01L 31/073; H01L 31/0749; H01L 31/0272;
(Continued)

(56) References Cited

U.S. PATENT DOCUMENTS

| 4,568,792 A * | 2/1986 | Mooney | H01L 31/0296 |
| | | | 136/260 |
| 5,676,766 A * | 10/1997 | Probst | H01L 31/02242 |
| | | | 136/265 |

(Continued)

OTHER PUBLICATIONS

Hernández, et al. "Influence of the Au interlayer on the contact resistance and morphology of CdTe films deposited on molybdenum substrate." Solar energy materials and solar cells 90.15 (2006): 2289-2296.*

(Continued)

*Primary Examiner* — William E McClain
(74) *Attorney, Agent, or Firm* — Scully, Scott, Murphy & Presser, P.C.; Rabin Bhattacharya

(57) ABSTRACT

A chalcogen-resistant material including at least one of a conductive elongated nanostructure layer and a high work function material layer is deposited on a transition metal layer on a substrate. A semiconductor chalcogenide material layer is deposited over the chalcogen-resistant material. The conductive elongated nanostructures, if present, can reduce contact resistance by providing direct electrically conductive paths from the transition metal layer through the chalcogen-resistant material and to the semiconductor chalcogenide material. The high work function material layer, if present, can reduce contact resistance by blocking chalcogenization of the transition metal in the transition metal layer. Reduction of the contact resistance can enhance efficiency of a solar cell including the chalcogenide semiconductor material.

15 Claims, 5 Drawing Sheets

Related U.S. Application Data application No. 13/558,383, filed on Jul. 26, 2012, now abandoned.

(51) Int. Cl.
*H01L 31/0392* (2006.01)
*H01L 31/0749* (2012.01)
*B82Y 30/00* (2011.01)

(52) U.S. Cl.
CPC ...... *H01L 31/0322* (2013.01); *H01L 31/0326* (2013.01); *H01L 31/03923* (2013.01); *H01L 31/0749* (2013.01); *B82Y 30/00* (2013.01); *Y02E 10/541* (2013.01)

(58) Field of Classification Search
CPC ....... H01L 31/0296–02966; H01L 31/022425; H01L 31/032–03365; H01L 31/035209–035227
See application file for complete search history.

(56) References Cited

U.S. PATENT DOCUMENTS

| | | | |
|---|---|---|---|
| 6,307,148 B1* | 10/2001 | Takeuchi | H01L 31/0322 136/252 |
| 7,713,773 B2 | 5/2010 | Aksu et al. | |
| 2003/0230338 A1 | 12/2003 | Menezes | |
| 2004/0095658 A1 | 5/2004 | Buretea et al. | |
| 2004/0219730 A1 | 11/2004 | Basol | |
| 2005/0194038 A1 | 9/2005 | Brabec et al. | |
| 2006/0131555 A1 | 6/2006 | Liu et al. | |
| 2007/0000537 A1* | 1/2007 | Leidholm | B82Y 10/00 136/252 |
| 2007/0093006 A1 | 4/2007 | Basol | |
| 2007/0128869 A1 | 6/2007 | Chen et al. | |
| 2008/0083454 A1 | 4/2008 | Park et al. | |
| 2008/0173390 A1 | 7/2008 | Narasimhan et al. | |
| 2008/0276987 A1 | 11/2008 | Flood | |
| 2009/0165856 A1 | 7/2009 | Lee et al. | |
| 2010/0102280 A1 | 4/2010 | Ford et al. | |
| 2010/0140101 A1 | 6/2010 | Aksu et al. | |
| 2010/0206362 A1 | 8/2010 | Flood | |
| 2010/0229931 A1 | 9/2010 | Reddy et al. | |
| 2010/0229940 A1 | 9/2010 | Basol et al. | |
| 2010/0269907 A1 | 10/2010 | Lackner et al. | |
| 2010/0300532 A1* | 12/2010 | Cumpston | H01L 31/0322 136/259 |
| 2010/0313951 A1 | 12/2010 | Nalamasu et al. | |
| 2011/0162705 A1 | 7/2011 | Popa et al. | |
| 2011/0220191 A1* | 9/2011 | Flood | B82Y 10/00 136/255 |
| 2011/0294254 A1 | 12/2011 | Jackrel et al. | |
| 2012/0167979 A1* | 7/2012 | Perng | B82Y 10/00 136/252 |
| 2013/0048059 A1 | 2/2013 | Han et al. | |
| 2013/0269764 A1 | 10/2013 | Barkhouse et al. | |
| 2014/0338741 A1 | 11/2014 | Palm et al. | |
| 2015/0221790 A1* | 8/2015 | Heben | H01L 31/02167 136/255 |

OTHER PUBLICATIONS

Hodges, et al. "Mechanical properties and adhesion of CdTe/CdS thin film solar cells deposited on flexible foil substrates." MRS Online Proceedings Library Archive 1165 (2009).*

Flood, "CdSe thin film solar cells utilizing a nanostructured back contact." 2010 35th IEEE Photovoltaic Specialists Conference. IEEE, 2010.*

Barnes, T. M. et al., "Single-Wall Carbon Nanotube Networks as a Transparent Back Contact in CdTe Solar Cells" Applied Physics Letters (Jun. 2007) pp. 243503-1-243503-3, vol. 90.

Contreras, M. A. et al., "Replacement of Transparent Conductive Oxides by Single-Wall Carbon Nanotubes in Cu(In,Ga)Se2-Based Solar Cells", The Journal of Physical Cehmistry C (Aug. 2007) pp. 14045-14048, vol. 111.

Chaure, et al, "Electrodeposition of p+, p, i, n and n+-type copper indium gallium diselenide for development of multilayer thin film solar cells", Thin Solid Films, Sep. 2004, pp. 212-216, vol. 472.

Biccari, et al., "Fabrication of CuZnSnS4 solar cells by sulfurization of evaporated precursors", European Materials Research Society Conference. Symp. Advanced Inorganic Materials and Concepts for Photovoltaics, vol. 1 O (2011 ), pp. 187-191.

Wada et al., "Characterization of the Cu(In,Ga)Se2/Mo interface in GIGS solar cells", Thin Solid Films, May 2001, pp. 118-122, vol. 387.

Kim et al., "Effects of Se atmosphere on the densification of absorber layer using Cu (In, Ga) Se2 nanoparticles for solar cells", Solid State Phenomena, 2007, Trans Tech Publications, Jun. 2007, pp. 983-986, vol. 124.

* cited by examiner ns the vertical cross-sectional view of a page from US patent 10,811,547 B2.

OHMIC CONTACT OF THIN FILM SOLAR CELL

BACKGROUND

The present disclosure relates to contact structures, and particularly to low resistance contact structures between a transition metal layer and a semiconductor material, and methods of manufacturing the same.

Many thin film solar cells include a chalcogenide in an absorber layer. The chalcogenide can be a chalcopyrite such as $CuIn(S,Se)_2$ (CIS) and $CuInGaSe_2$ (CIGS), kesterite $(Cu_2(Zn, Fe) Sn (Se,S)_4$, $Ga(S,Se)$, $GaTe$, $In_2(S,Se)_3$, and $InTe$, $CdTe$, $Cd(S, Se)$, $ZnTe$, $Pb(Se,S)$, $Zn(S, Se)$, $W(S,Se)_2$, $Bi_2S_3$, $Ag_2S$, $NiS$, $ZnO$, $Cu_2O$, $CuO$, $Cu_2S$, $FeS_2$. These solar cells have been fabricated using different process like PVD, CVD, solution processes, or electrochemical deposition process.

For example, in thin films solar cells, a back contact material such as molybdenum is deposited on a dielectric substrate. Absorber layers, such as a stack of a p-type semiconductor material and an n-type semiconductor material, are deposited on the back contact material. Whether sulfur, selenium, tellurium, oxygen is introduced into molybdenum during deposition or not, an anneal process that is performed above 350 degrees Celsius to sulfurize the absorber layer also causes sulfurization of molybdenum. A compound such as molybdenum disulfide ($MoS_2$) is formed during the sulfurization.

Formation of excess molybdenum disulfide between a molybdenum layer and the absorber layer may cause a poor ohmic contact between the molybdenum layer and the absorber layer. Further, due to high compressive stress developed in the absorber layer, gaps can be formed within the molybdenum sulfide layer, and significantly degrade the electrical contact between the absorber layer and the molybdenum layer. By effectively reducing the total contact area between the absorber layer and the molybdenum layer, such gaps increase the series resistance of a solar cell, and reduces the efficiency of the solar cell.

BRIEF SUMMARY

A chalcogen-resistant material including at least one of a carbon nanotube layer and a high work function material layer is deposited on a transition metal layer on a substrate. A semiconductor chalcogenide material layer is deposited over the chalcogen-resistant material. The carbon nanotubes, if present, can reduce contact resistance by providing direct electrically conductive paths from the transition metal layer through the chalcogen-resistant material and to the semiconductor chalcogenide material. The high work function material layer, if present, can reduce contact resistance by reducing chalcogenization of the transition metal in the transition metal layer. Reduction of the contact resistance can enhance efficiency of a solar cell including the chalcogenide semiconductor material.

According to an aspect of the present disclosure, a semiconductor structure is provided, which includes: a transition metal layer including at least one transition metal element and located on a substrate; a plurality of carbon nanotubes in contact with a surface of the transition metal layer; and a semiconductor material layer in contact with the plurality of carbon nanotubes.

According to another aspect of the present disclosure, a semiconductor structure is provided, which includes: a transition metal layer including at least one transition metal element and located on a substrate; a high work function transition metal element layer including at least one elemental metal having a work function greater than 4.6 eV and contacting a surface of the transition metal layer, wherein the at least one transition metal element has a work function less than any work function of the at least one elemental metal; and a semiconductor material layer in contact with the high work function transition metal element layer.

According to yet another aspect of the present disclosure, a method of forming electrical contact to a semiconductor is provided. The method includes: depositing a plurality of carbon nanotubes on a surface of a transition metal layer including at least one transition metal element; and depositing a semiconductor material layer including a semiconductor chalcogenide material directly on the plurality of carbon nanotubes.

According to still another aspect of the present disclosure, a method of forming electrical contact to a semiconductor chalcogenide is provided. The method includes: providing a substrate with a transition metal layer including at least one transition metal element having a work function that does not exceed 4.6 eV thereupon; forming a high work function transition metal element layer including at least one elemental metal having a work function greater than 4.6 eV directly on a surface of the transition metal layer; and depositing a semiconductor material layer including a semiconductor chalcogenide material directly on the high work function transition metal element layer.

DETAILED DESCRIPTION

Figure 1:
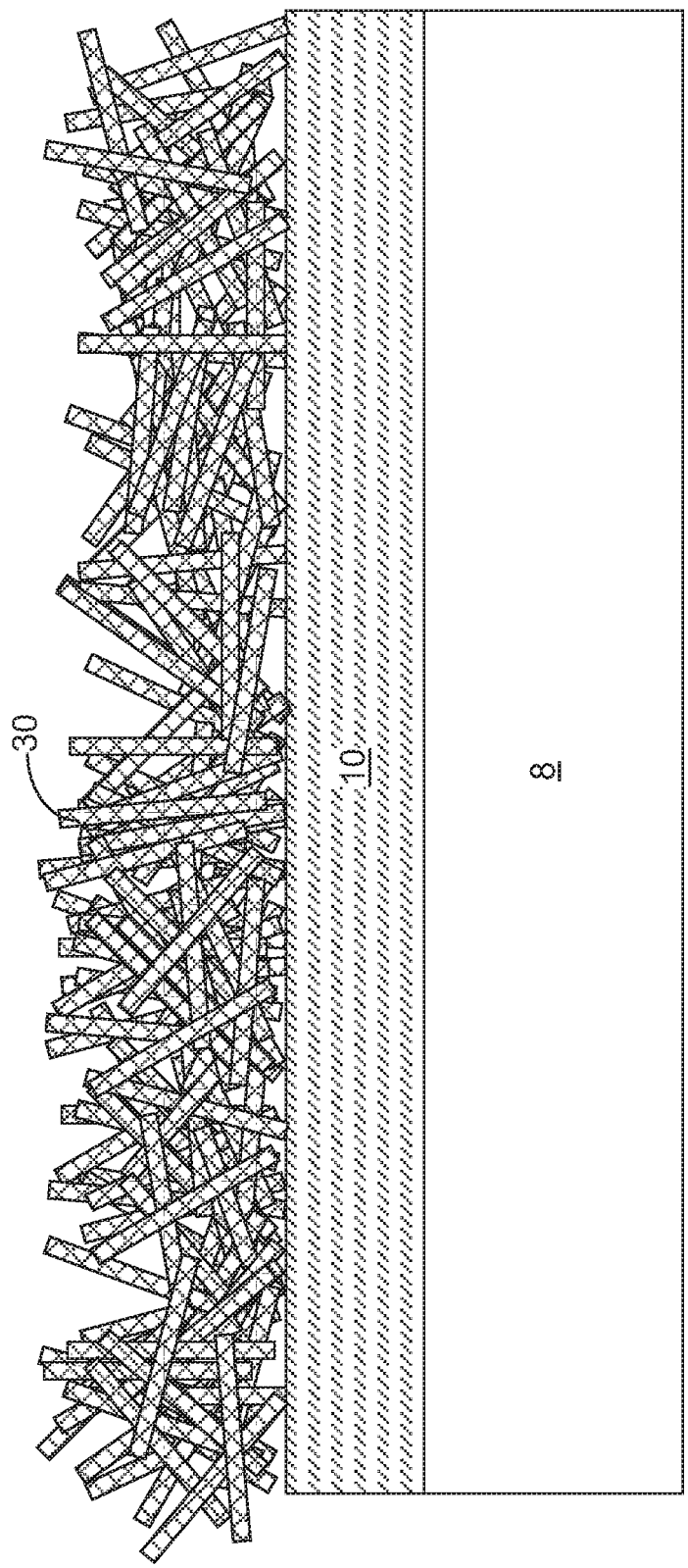
FIG. 1 is a vertical cross-sectional view of a first exemplary structure after deposition of carbon nanotubes on a transition metal layer formed on a substrate according to a first embodiment of the present disclosure.

As stated above, the present disclosure relates to low resistance contact structures between a transition metal layer and a semiconductor chalcogenide material, and methods of manufacturing the same, which are now described in detail with accompanying figures. It is noted that like reference numerals refer to like elements across different embodiments.

Referring to FIG. 1, a first exemplary structure according to a first embodiment of the present disclosure includes a transition metal layer 10 formed on a substrate 8. In one embodiment, the substrate 8 can be an insulator substrate including a dielectric material such as glass or a plastic material. In another embodiment, the substrate 8 can be a metallic substrate including a diffusion barrier layer on the top surface thereof. The diffusion barrier layer can be a metallic nitride layer such as tantalum nitride or titanium nitride, and prevents diffusion of metallic materials from a lower portion of the substrate 8 to a transition metal layer to be subsequently deposited, or vice versa.

The transition metal layer 10 includes at least one transition metal element in elemental form or in combination with one or more different transition metal element. As used herein, a "transition metal element" refers to Group IB elements, Group IIB elements, Group IIIB elements including Lanthanides and Actinides, Group IVB elements, Group VB elements, Group VIB elements, Group VIIB elements, Group VIIIB elements. In one embodiment, the transition metal layer 10 can include one or more of any of the transition metal elements.

In one embodiment, the transition metal layer 10 includes a "low work function transition metal element." As used herein, a "low work function transition metal element" is a transition metal element having a work function that does not exceed 4.6 eV, i.e., having a work function that is 4.6 eV or less. As used herein, a "high work function transition metal element" refers to a transition metal element having a work function greater than 4.6 eV. Table 1 below lists the work functions of selected transition metal elements.

TABLE 1

Work function of selected transition metal elements

| Element | Work function |
| --- | --- |
| Tb | 3.0 |
| Y | 3.1 |
| Nd | 3.2 |
| Lu | 3.3 |
| Th | 3.4 |
| U | 3.63 |
| Hf | 3.9 |
| La | 4.0 |
| Zr | 4.05 |
| Cd | 4.08 |
| Mn | 4.1 |
| Nb | 4.3 |
| V | 4.3 |
| Zn | 4.3 |
| Ti | 4.33 |
| Mo | 4.37 |
| Hg | 4.475 |
| Cr | 4.5 |
| W | 4.5 |
| Ru | 4.71 |
| Re | 4.72 |
| Rh | 4.98 |
| Co | 5.0 |
| Au | 5.1 |
| Ir | 5.3 |
| Pd | 5.55 |
| Os | 5.93 |
| Pt | 5.93 |

In one embodiment, the transition metal layer 10 consists essentially of the at least one transition metal. In one embodiment, the transition metal layer 10 can consist essentially of at least one low work function transition metal element. In one embodiment, the transition metal layer 10 can consist essentially of at least one low work function transition metal element selected from Nb, V, Zn, Ti, Mo, Cr, and W. In one embodiment, the transition metal layer 10 can consist essentially of Mo.

A plurality of carbon nanotubes 30 are formed on the front surface of the transition metal layer 10. The plurality of carbon nanotubes 30 can be formed, for example, by arc discharge, laser ablation, and/or chemical vapor deposition (CVD). In an arch discharge process, carbon atoms contained in a negative electrode sublimates to form carbon nanotubes. In a laser ablation process, a pulsed laser vaporizes a graphite target in a high-temperature reactor in an inert gas subatmospheric ambient, and carbon nanotubes are formed as the vaporized carbon atoms condense on cooler surfaces of the reactor. In a chemical vapor deposition process (CVD), a layer of metal catalyst particles, e.g., nickel, cobalt, or iron, is heated and a process gas (such as ammonia, nitrogen or hydrogen) and a carbon-containing gas (such as acetylene, ethylene, ethanol or methane) are introduced into a process chamber so that carbon nanotubes are formed by thermal catalytic decomposition of hydrocarbon. In addition, the plurality of carbon nanotubes 30 can be deposited by preparing carbon nanotubes by any method known in the art, and by spraying the carbon nanotubes over the transition metal layer 10, or by spin-coating the carbon nanotubes employing a suitable solvent (such as alcohol) that evaporates after application.

The plurality of carbon nanotubes 30 can be deposited without alignment. Thus, the plurality of carbon nanotubes 30 can have a random distribution of spatial orientations.

In one embodiment, the plurality of carbon nanotubes 30 can be predominantly metallic, i.e., more than 50% of the plurality of carbon nanotubes 30 can be metallic carbon nanotubes. In one embodiment, more than 90% of the plurality of carbon nanotubes 30 can be metallic carbon nanotubes. In one embodiment, more than 99% of the plurality of carbon nanotubes 30 can be metallic carbon nanotubes.

The plurality of carbon nanotubes 30 is in contact with the top surface of the transition metal layer 10. The average length of the carbon nanotubes among the plurality of carbon nanotubes 30 can be from 1 micron to 300 microns, although lesser and greater thicknesses can also be employed. The thickness of the plurality of carbon nanotubes, as measured from the top surface of the transition metal layer 10 to the highest position of the plurality of carbon nanotubes can be from 1 micron to 300 microns, although lesser and greater thicknesses can also be employed. The plurality of carbon nanotubes 30 are deposited at such a density that the average number of other carbon nanotubes 30 that each carbon nanotube 30 is in physical contact with is from 5 to 500. In one embodiment, the areal coverage of the top surface of the transition metal layer 10 by the plurality of carbon nanotubes can be from 25% to 99.9%, although lesser and greater areal coverage can also be employed.

Figure 2:
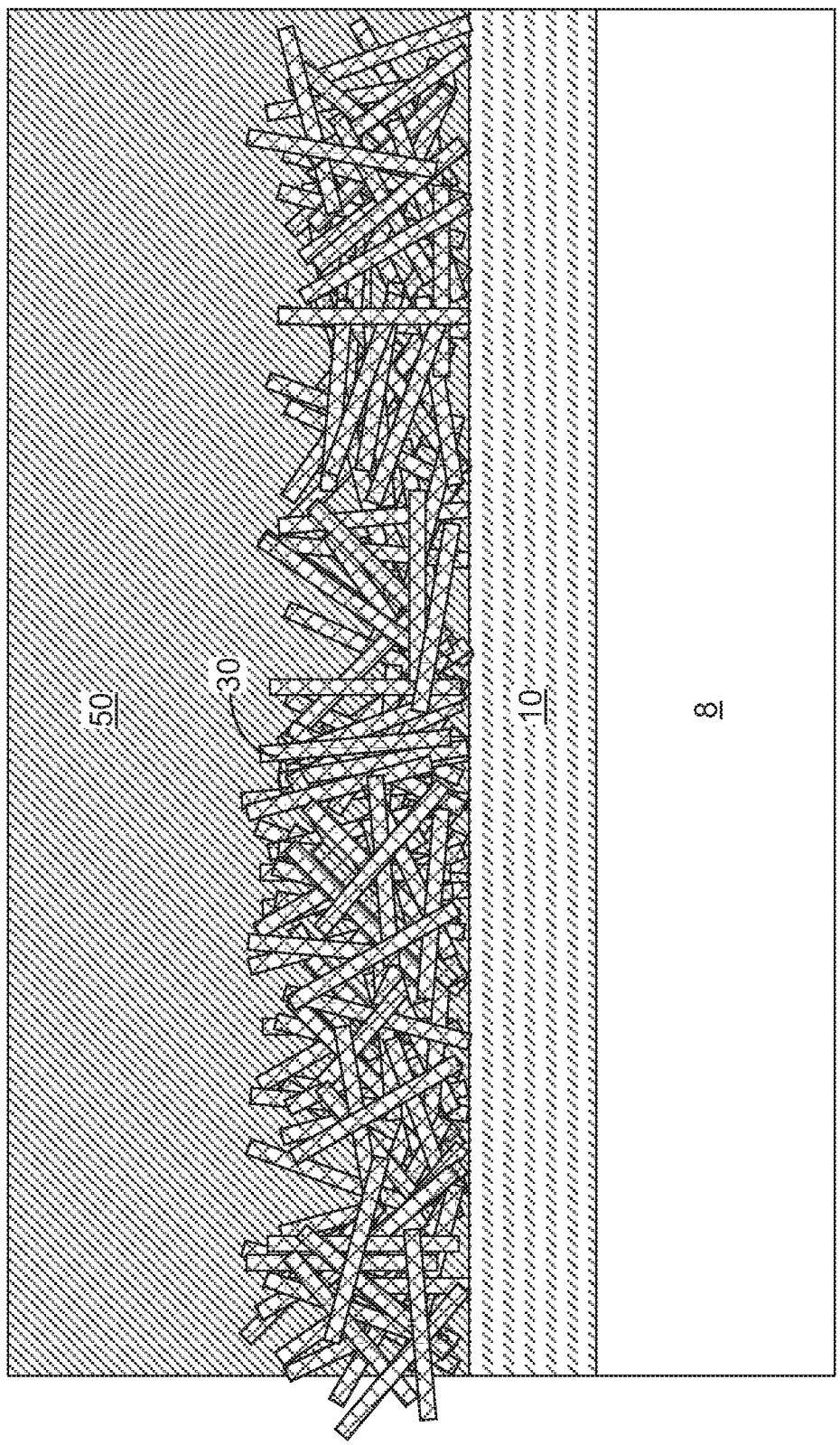
FIG. 2 is a vertical cross-sectional view of the first exemplary structure after formation of a semiconductor chalcogenide material layer according to the first embodiment of the present disclosure.

Referring to FIG. 2, a semiconductor material layer 50 is deposited over the plurality of carbon nanotubes 30. The semiconductor material layer 50 can be deposited, for example, by physical vapor deposition (PVD), chemical vapor deposition (CVD), electroplating, electroless plating, or a combination thereof. The average thickness of the semiconductor chalcogenide material layer 50, which can be derived by dividing the total volume of the semiconductor chalcogenide material layer 50 by the total area over which the semiconductor chalcogenide material layer 50 is deposited, can be from 500 nm to 300 microns, although lesser and greater thicknesses can also be employed.

The semiconductor chalcogenide material layer 50 includes a semiconductor chalcogenide material. As used herein, a "chalcogenide" refers to the group consisting of sulfides, selenides, and tellurides. As used herein, a "semiconductor material" refers to a material having a conductivity in the range of $10^3$ Siemens per centimeter to $10^{-8}$ Siemens per centimeter. As used herein, a "semiconductor chalcogenide material" refers to a semiconductor material that includes a chalcogenide at an atomic concentration greater than 5%.

Non-limiting examples of semiconductor chalcogenide material include $CuIn(Se, S)_2$ (CIS), $CuInGaSe_2$ (CIGS), $Cu_2(Zn,Fe)Sn(Se,S)_4$, $Ga(S,Se)$, $GaTe$, $In_2(S,Se)_3$, $InTe$, $CdTe$, $Cd(S, Se)$, $ZnTe$, $Pb(Se,S)$, $Zn(S, Se)$, $W(S,Se)_2$, $Bi_2S_3$, $Ag_2S$, $NiS$, $ZnO$, $Cu_2O$, $CuO$, $Cu_2S$, $FeS_2$. The semiconductor material of the semiconductor chalcogenide material layer 50 can be single crystalline, polycrystalline, or amorphous. The semiconductor chalcogenide material layer 50 can be thick enough to provide mechanical support to additional structures that are subsequently formed on the semiconductor chalcogenide material layer 50. For example, the thickness of the semiconductor chalcogenide material layer 50 can be from 50 microns to 2 cm, although lesser and greater thicknesses can also be employed.

The semiconductor material of the semiconductor chalcogenide material layer 50 can have a p-type doping, an n-type doping, or intrinsic. In one embodiment, the semiconductor chalcogenide material layer 50 can include a p-n junction and a p-type semiconductor chalcogenide material can extend to the top surface of the semiconductor chalcogenide material layer 50. In one embodiment, the p-n junction in the semiconductor chalcogenide material layer 50 can be employed to form a photovoltaic device by forming electrical contact structures directly to the front side of the semiconductor chalcogenide material layer 50, and indirectly to the back side of the semiconductor chalcogenide material layer 50 through the transition metal layer 10.

The semiconductor layer 50 is in physical contact with the plurality of carbon nanotubes 50, and can be in physical contact with a predominant portion (i.e., greater than 50%) of the top surfaces of the semiconductor chalcogenide material layer 50 that are not in physical contact with the plurality of carbon nanotubes 30. In one embodiment, the semiconductor chalcogenide material can be a semiconductor sulfide, selenide, telluride material such as $CuIn(Se,S)_2$ (CIS), $CuInGaSe_2$ (CIGS), and $Cu_2(Zn,Fe)Sn(Se,S)_4$, $Ga(S, Se)$, $GaTe$, $In_2(S,Se)_3$, and $InTe$, $CdTe$, $Cd(S, Se)$, $ZnTe$, $Pb(Se,S)$, $Zn(S, Se)$, $W(S,Se)_2$, $Bi_2S_3$, $Ag_2S$, $NiS$, $ZnO$, $Cu_2O$, $CuO$, $Cu_2S$, $FeS_2$.

Figure 3:
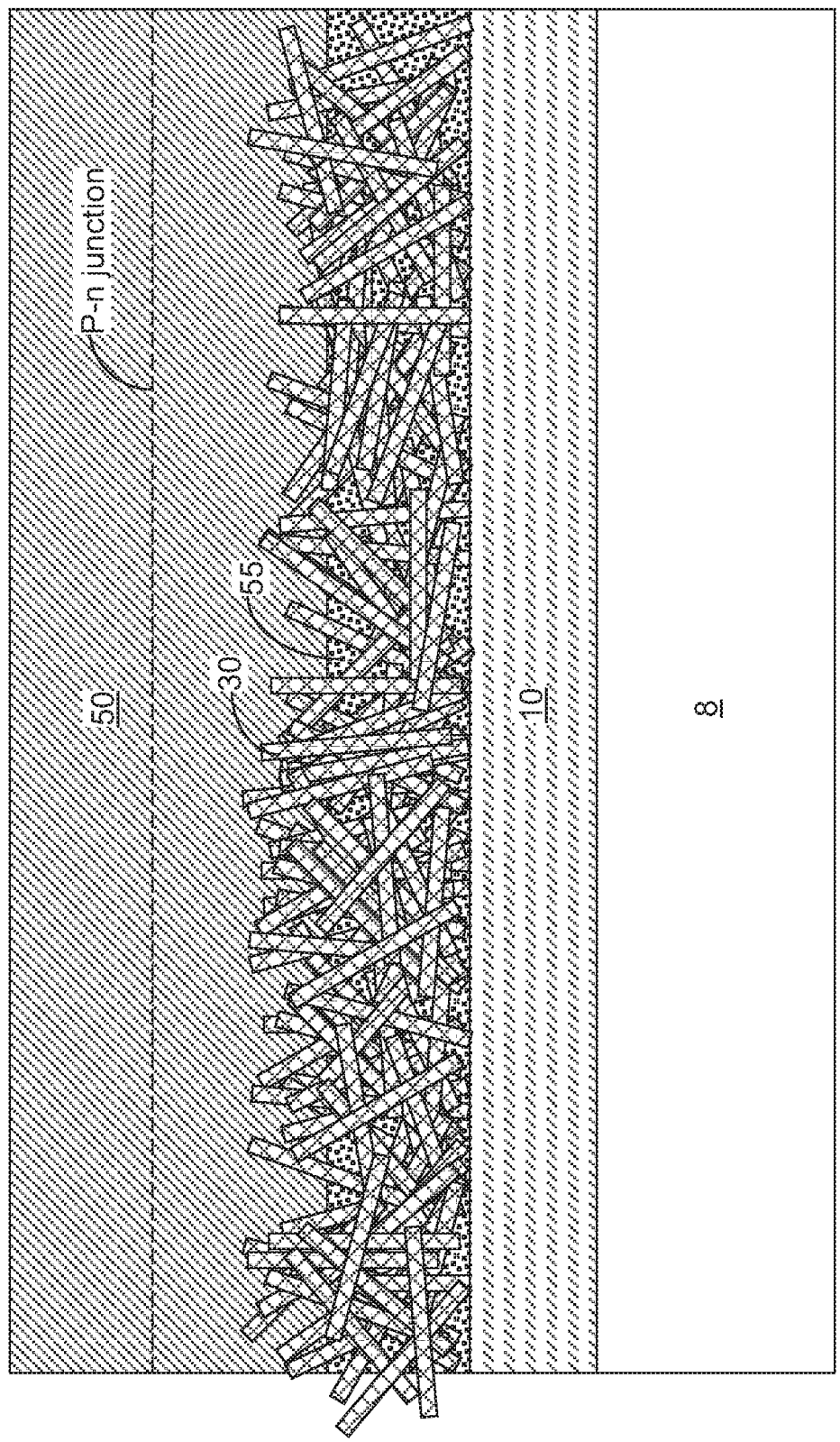
FIG. 3 is a vertical cross-sectional view of the first exemplary structure after an anneal that forms a transition metal chalcogenide layer according to the first embodiment of the present disclosure.

Referring to FIG. 3, a thermal anneal is performed at a temperature that induces interaction between the at least one transition metal(s) in the transition metal layer 10 and the semiconductor chalcogenide material in the semiconductor chalcogenide material layer 50. A transition metal chalcogenide layer 55 including the chalcogenide element(s) of the semiconductor material of the semiconductor chalcogenide material layer 50 and the at least one transition metal element in the transition metal layer 10 is formed by the interaction between the semiconductor material in the semiconductor chalcogenide material layer 50 and the at least one transition metal in the transition metal layer 10.

The temperature of the thermal anneal can be any elevated temperature that causes formation of a metal chalcogenide compound from the chalcogenide element of the semiconductor material 50 and the at least one transition metal element in the transition metal layer 50. In one embodiment, the chalcogenide element of the semiconductor material can be sulfur, i.e., the semiconductor chalcogenide material can be a semiconductor sulfide material, and the temperature of the thermal anneal can be a temperature at or above 350 degrees Celsius.

The thermal anneal can be a stand-alone anneal process, i.e., an anneal process performed for the purpose of forming the metal chalcogenide compound, or can be an anneal process that accompanies another process, e.g., a deposition process for adding another material to the first exemplary structure, i.e., a collateral thermal anneal process that accompanies another process.

The thickness of the transition metal chalcogenide layer 55 can be from 20 nm to 5 microns, although lesser and greater thicknesses can also be employed. The transition metal chalcogenide 55 is in contact with the at least one transition metal of the transition metal layer 10 and the remaining portion of the semiconductor chalcogenide material layer 50.

At least a fraction of the plurality of carbon nanotubes 30 extends through the transition metal chalcogenide layer 55 to make physical contacts with the at least one transition metal of the transition metal layer 10 and the semiconductor material of the semiconductor chalcogenide material layer 50. In one embodiment, a predominant portion of the plurality of carbon nanotubes 30 extends through the transition metal chalcogenide layer 55 to make physical contacts with the at least one transition metal of the transition metal layer 10 and the semiconductor chalcogenide material of the semiconductor chalcogenide material layer 50. The plurality of carbon nanotubes 30 includes portions, which are herein referred to as "first portions," that are embedded within the transition metal chalcogenide layer 55. Further, the plurality of carbon nanotubes 30 includes other portions, which are herein referred to as "second portions," that are embedded in the semiconductor material layer 50.

In one embodiment, the transition metal chalcogenide layer 55 consists essentially of a chalcogenide of the at least one transition metal that is present in the semiconductor chalcogenide material layer 50. In one embodiment, the transition metal chalcogenide layer 55 can consist essentially of a chalcogenide of the at least one low work function transition metal element that is present in the transition metal layer 10. In one embodiment, the transition metal chalcogenide layer 55 can consist essentially of a chalcogenide of the at least one low work function transition metal element that is present in the transition metal layer 10 and is selected from Nb, V, Zn, Ti, Mo, Cr, and W. In one embodiment, the transition metal chalcogenide layer 55 can consist essentially of a chalcogenide of Mo.

In one embodiment, the transition metal chalcogenide layer 55 consists essentially of a sulfide of the at least one transition metal that is present in the transition metal layer 10. In one embodiment, the transition metal chalcogenide layer 55 can consist essentially of a sulfide of the at least one low work function transition metal element that is present in the semiconductor chalcogenide material layer 50. In one embodiment, the transition metal chalcogenide layer 55 can consist essentially of a sulfide of the at least one low work function transition metal element that is present in the transition metal layer 10 and is selected from Nb, V, Zn, Ti, Mo, Cr, and W. In one embodiment, the transition metal chalcogenide layer 55 can consist essentially of a sulfide/selenide of Mo.

The plurality of carbon nanotubes 30 provide electrically conductive paths between the transition metal layer 10 and the semiconductor chalcogenide material layer 50 in addition to the electrically conductive paths including the transition metal layer 10, the transition metal chalcogenide layer 55, and the semiconductor chalcogenide material layer 50. The electrical contact between the transition metal layer 10 and the semiconductor chalcogenide material layer 50 is functionally intact even when gaps or cavities develop within the transition metal chalcogenide layer 55 during a normal chalcogenide formation processes or variations in the chalcogenide formation processes. Thus, the reliability of the electrical contact between the transition metal layer 10 and the semiconductor material of the semiconductor chalcogenide material layer 50 is enhanced due to the presence of the plurality of carbon nanotubes 30 over a comparative structure that does not include carbon nanotubes.

Figure 4:
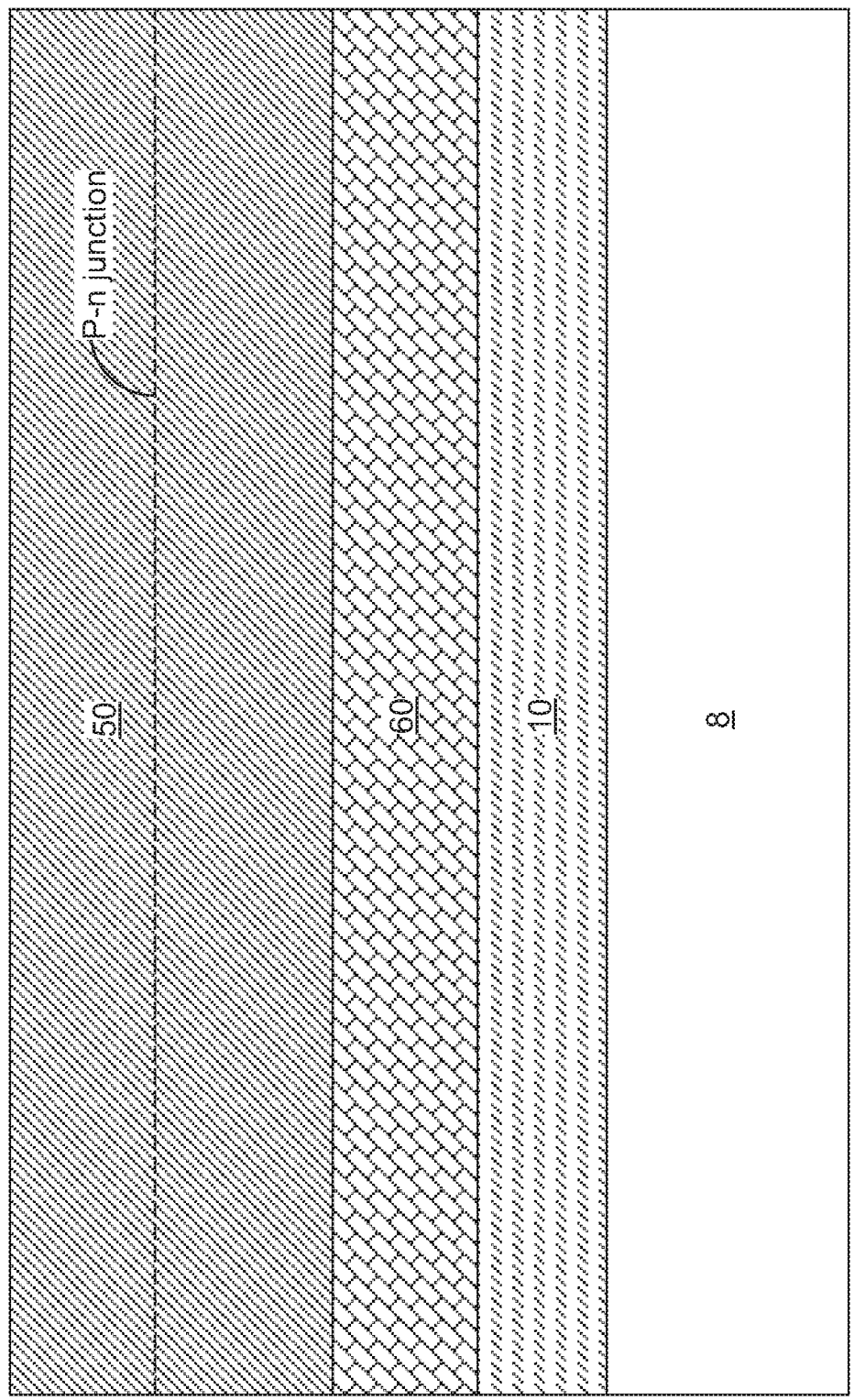
FIG. 4 is a vertical cross-sectional view of a second exemplary structure after deposition of a high work function transition metal element layer according to a second embodiment of the present disclosure.

Referring to FIG. 4, a second exemplary structure according to a second embodiment of the present disclosure can be formed by providing a transition metal layer 10 on a substrate 8 in the same manner as in the first embodiment.

In one embodiment, the transition metal layer 10 consists essentially of the at least one transition metal, which can include any transition material. In one embodiment, the transition metal layer 10 can consist essentially of at least one low work function transition metal element. In one embodiment, the transition metal layer 10 can consist essentially of at least one low work function transition metal element selected from Nb, V, Zn, Ti, Mo, Cr, and W. In one embodiment, the transition metal layer 10 can consist essentially of Mo.

A high work function transition metal element layer 60 is deposited directly on the top surface of the transition metal layer 10, for example, by physical vapor deposition (PVD), chemical vapor deposition (CVD), electroplating, and/or electroless plating. The high work function transition metal element layer 60 includes at least one high work function transition metal element, i.e., at least one transition metal element having a work function greater than 4.6. For example, the high work function transition metal element layer 60 can include at least one high work function transition metal element listed in Table 1.

In one embodiment, the high work function transition metal element layer 60 includes at least one element selected Co, Ru, Rh, Pd, Os, Ir, Pt, and Au.

In one embodiment, the high work function transition metal element layer 60 includes at least one of platinum and ruthenium.

In one embodiment, the high work function transition metal element layer 60 consists essentially of at least one high work function transition metal element that is in elemental form or in the form of an alloy between or among two or more high work function transition metal elements.

The thickness of the high work function transition metal element layer 60 can be from 10 nm to 1 micron, although lesser and greater thicknesses can also be employed. In one embodiment, the thickness of the high work function transition metal element layer 60 can be from 50 nm to 200 nm.

The high work function transition metal element layer 60 can have a contiguous bottom surface contacting the transition metal layer 10 and not including any hole therein. Further, the high work function transition metal element layer 60 can have a contiguous planar top surface that does not include any hole or protrusion.

In one embodiment, the materials of the high work function transition metal element layer 60 and the transition metal layer 10 can be selected such that the high work function transition metal element layer 60 includes at least one elemental metal having a work function greater than 4.6 eV and greater than any work function of the at least one transition metal element present in the transition metal layer 10. In one embodiment, the materials of the high work function transition metal element layer 60 and the transition metal layer 10 can be selected such that the high work function transition metal element layer 60 consists essentially of at least one elemental metal having a work function greater than 4.6 eV and greater than any work function of the at least one transition metal element present in the transition metal layer 10.

A semiconductor chalcogenide material layer 50 is deposited on the top surface of the high work function transition metal element layer 60. The semiconductor chalcogenide material layer 50 in the second exemplary structure can include any semiconductor material that can be employed in the semiconductor chalcogenide material layer 50 in the first exemplary structure.

The semiconductor chalcogenide material layer 50 has a contiguous planar bottom surface, which is in physical contact with the contiguous planar top surface of the high work function transition metal element layer 60.

The semiconductor chalcogenide material layer 50 can be deposited, for example, by physical vapor deposition (PVD), chemical vapor deposition (CVD), electroplating, electroless plating, or a combination thereof. The thickness of the semiconductor chalcogenide material layer 50 can be from 500 nm to 300 microns, although lesser and greater thicknesses can also be employed.

During thermal processing in which the temperature of the second exemplary structure is elevated above room temperature, i.e., 20 degrees Celsius, the high work function transition metal element layer 60 prevents or retards the diffusion of chalcogenide atoms into the semiconductor chalcogenide material layer 50. Thus, the second exemplary structure as illustrated in FIG. 4 is maintained even after thermal processing that is required to form additional contact structures to the semiconductor chalcogenide material layer 50, for example, to form various contact terminals for a photovoltaic device including the transition metal layer 10. The work function transition metal element layer 60 provides a reliable electrically conductive path between the transition metal layer 10 and the semiconductor chalcogenide material of the semiconductor chalcogenide material layer 50 that does not degrade during thermal processing or during operation of a device including the transition metal layer 10.

Figure 5:
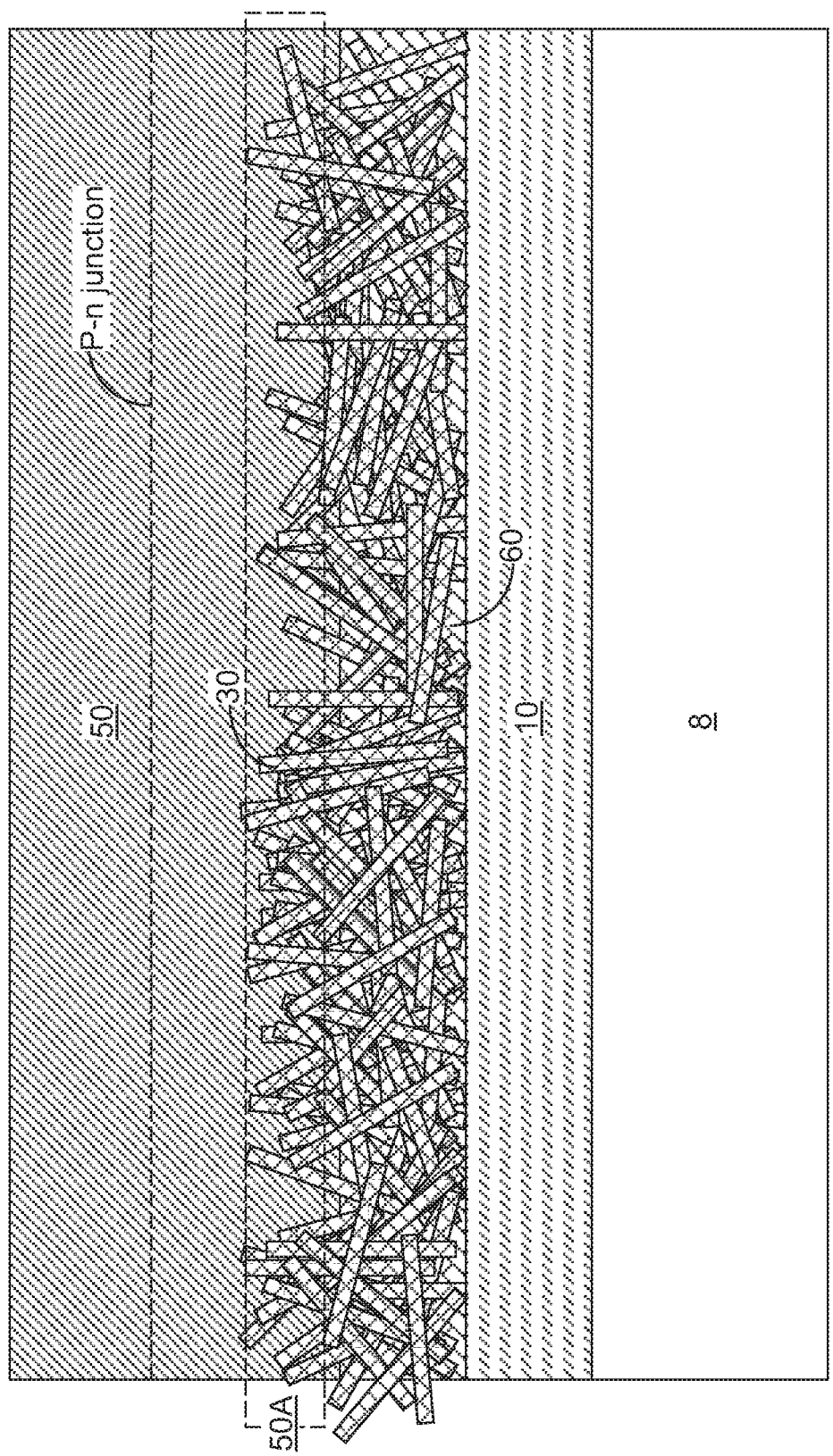
FIG. 5 is a vertical cross-sectional view of a third exemplary structure after deposition of carbon nanotubes and a high work function transition metal element layer according to a third embodiment of the present disclosure.

Referring to FIG. 5, a third exemplary structure according to a third embodiment of the present disclosure is derived from the first exemplary structure of FIG. 1 by depositing a high work function transition metal element layer 60 and a transition metal element layer 50. The high work function transition metal element layer 60 can have the same composition as, and can be formed employing the same methods as, in the second embodiment. The transition metal element layer 50 can have the same composition as, and can be formed employing the same methods as, in the first and second embodiments.

In one embodiment, the transition metal layer 10 can include any transition metal element that is different from the high work function transition metal element(s) that is/are present in the high work function transition metal element layer 60. In one embodiment, the transition metal layer 10 can include at least one low work function transition metal element. In one embodiment, the transition metal layer 10 can consist essentially of at least one low work function transition metal element.

In one embodiment, the materials of the high work function transition metal element layer 60 and the transition metal layer 10 can be selected such that the high work function transition metal element layer includes at least one elemental metal having a work function greater than 4.6 eV and greater than any work function of the at least one transition metal element present in the transition metal layer 10. In one embodiment, the materials of the high work function transition metal element layer 60 and the transition metal layer 10 can be selected such that the high work function transition metal element layer consists essentially of at least one elemental metal having a work function greater than 4.6 eV and greater than any work function of the at least one transition metal element present in the transition metal layer 10.

In one embodiment, the transition metal layer 10 consists essentially of the at least one transition metal, which can include any transition material. In one embodiment, the transition metal layer 10 can consist essentially of at least one low work function transition metal element. In one embodiment, the transition metal layer 10 can consist essentially of at least one low work function transition metal element selected from Nb, V, Zn, Ti, Mo, Cr, and W. In one embodiment, the transition metal layer 10 can consist essentially of Mo.

Specifically, the high work function transition metal element layer 60 is deposited directly on the top surface of the transition metal layer 10, for example, by physical vapor deposition (PVD), chemical vapor deposition (CVD), electroplating, and/or electroless plating. The high work function transition metal element layer 60 includes at least one high work function transition metal element, i.e., at least one transition metal element having a work function greater than 4.6. For example, the high work function transition metal element layer 60 can include at least one high work function transition metal element listed in Table 1.

In one embodiment, the high work function transition metal element layer 60 includes at least one element selected Co, Ru, Rh, Pd, Os, Ir, Pt, and Au.

In one embodiment, the high work function transition metal element layer 60 includes at least one of platinum and ruthenium.

In one embodiment, the high work function transition metal element layer 60 consists essentially of at least one high work function transition metal element that is in elemental form or in the form of an alloy between or among two or more high work function transition metal elements.

In one embodiment, the thickness of the high work function transition metal element layer 60 can be less than the maximum height of the plurality of carbon nanotubes, i.e., the vertical distance between the top surface of the transition metal layer 10 and the highest point of the plurality of carbon nanotubes 30. In one embodiment, the thickness of the high work function transition metal element layer 60 can be from 10 nm to 1 micron, although lesser and greater thicknesses can also be employed. In one embodiment, the thickness of the high work function transition metal element layer 60 can be from 50 nm to 200 nm.

The semiconductor chalcogenide material layer 50 is deposited on the top surface of the high work function transition metal element layer 60. The semiconductor chalcogenide material layer 50 in the third exemplary structure can include any semiconductor material that can be employed in the semiconductor chalcogenide material layer 50 in the first or second exemplary structure.

The semiconductor chalcogenide material layer 50 can be deposited, for example, by physical vapor deposition (PVD), chemical vapor deposition (CVD), electroplating, electroless plating, or a combination thereof. The thickness of the semiconductor chalcogenide material layer 50 can be from 500 nm to 300 microns, although lesser and greater thicknesses can also be employed. A p-n junction can be formed within the semiconductor chalcogenide material layer 50, for example, by changing dopants between deposition of a lower portion and an upper portion of the semiconductor chalcogenide material layer 50 from p-type dopants to n-type dopants, or vice versa.

At least a fraction of the plurality of carbon nanotubes 30 extends through the high work function transition metal element layer 60 to make physical contacts with the transition metal layer 10 and the semiconductor material of the semiconductor chalcogenide material layer 50. In one embodiment, a predominant portion of the plurality of carbon nanotubes 30 extends through the high work function transition metal element layer 60 to make physical contacts with the transition metal layer 10 and the semiconductor chalcogenide material of the semiconductor chalcogenide material layer 50. The plurality of carbon nanotubes 30 includes portions, which are herein referred to as "first portions," that are embedded within the high work function transition metal element layer 60. Further, the plurality of carbon nanotubes 30 includes other portions, which are herein referred to as "second portions," that are embedded in the semiconductor chalcogenide material layer 50.

The plurality of carbon nanotubes 30 provide electrically conductive paths between the transition metal layer 10 and the semiconductor chalcogenide material layer 50 in addition to the electrically conductive paths including the transition metal layer 10, the high work function transition metal element layer 60, and the semiconductor chalcogenide material layer 50. Further, the high work function transition metal element layer 60 prevents or retards the diffusion of chalcogenide atoms from the semiconductor chalcogenide material layer 50 toward the transition metal layer 10, thereby preventing or retarding formation of metal chalcogenides from the at least one transition metal element in the transition metal layer 10. Thus, the reliability of the electrical contact between the transition metal layer 10 and the semiconductor chalcogenide material in the semiconductor chalcogenide material layer 50 can be enhanced due to the presence of the plurality of carbon nanotubes 30 and due to the presence of the high work function transition metal element layer 60 over comparative structures that do not include carbon nanotubes and/or a high work function transition metal element layer. The combination of the plurality of carbon nanotubes 30 and the high work function transition metal element layer 60 can provide a reliable electrically conductive path between the transition metal layer 10 and the semiconductor chalcogenide material of the semiconductor chalcogenide material layer 50 that does not degrade during thermal processing or during operation of a device including the transition metal layer 10.

In embodiments in which the plurality of carbon nanotubes 30 are embedded within the high work function transition metal element layer 60 and in the semiconductor chalcogenide material layer 50, the plurality of carbon nanotubes 30 functions as a mechanical bridge that enhances the strength of mechanical adhesion between the high work function transition metal element layer 60 and the semiconductor chalcogenide material layer 50. The enhanced mechanical adhesion strength between the high work function transition metal element layer 60 and the semiconductor chalcogenide material layer 50 can prevent delamination at the interface between the high work function transition metal element layer 60 and the semiconductor chalcogenide material layer 50.

While the disclosure has been described in terms of specific embodiments, it is evident in view of the foregoing description that numerous alternatives, modifications and variations will be apparent to those skilled in the art. The various embodiments of the present disclosure can be implemented solely, or in combination with any other embodiments described herein unless incompatibility among various embodiments are expressly stated or otherwise clear to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
a transition metal layer comprising at least one transition metal element and located directly on a surface of a metallic nitride diffusion barrier layer that is located on a surface of a metallic substrate;
a plurality of conductive elongated nanostructures in contact with a surface of said transition metal layer;
a semiconductor chalcogenide material layer in contact with said plurality of conductive elongated nanostructures, wherein said semiconductor chalcogenide material layer includes a lower portion of a first conductivity type, and an upper portion of a second conductivity type that is different from said first conductivity type, wherein an n-p junction is located at an interface between said lower portion and said upper portion; and
a high work function transition metal element layer comprising at least one elemental metal having a work function greater than 4.6 eV and greater than any work function of said at least one transition metal element, and contacting a surface of said semiconductor chalcogenide material layer and a surface of said transition metal layer, wherein first portions of said plurality of conductive elongated nanostructures are embedded within said high work function transition metal element layer and some of said first portions of said plurality of conductive elongated nanostructures that are embedded in the high work function transition metal element layer directly contact, and stop on, a topmost surface of said transition metal layer, second portions of said plurality of conductive elongated nanostructures are entirely embedded in said lower portion of semiconductor chalcogenide material layer, and said upper portion of said semiconductor chalcogenide material layer and said transition metal layer are devoid of said conductive elongated nanostructures, and wherein an entirety of semiconductor chalcogenide material layer is spaced apart from said transition metal layer by said high work function transition metal element layer.

2. The semiconductor structure of claim 1, wherein said high work function transition metal element layer comprises at least one element selected from Group VIIIB elements, Group IB elements, and Re.

3. The semiconductor structure of claim 1, wherein said high work function transition metal element layer comprises at least one element selected from Co, Ru, Rh, Pd, Os, Ir, Pt, and Au.

4. The semiconductor structure of claim 1, wherein said semiconductor chalcogenide material is a semiconductor sulfide material.

5. The semiconductor structure of claim 1, wherein said at least one transition metal element comprises molybdenum.

6. The semiconductor structure of claim 1, wherein said plurality of conductive elongated nanostructures is predominantly metallic, and has a random distribution of spatial orientations.

7. The semiconductor structure of claim 1, wherein said transition metal layer consists essentially of said at least one transition metal element.

8. The semiconductor structure of claim 7, wherein said at least one transition metal element is selected from Nb, V, Zn, Ti, Mo, Cr, and W.

9. The semiconductor structure of claim 1, further comprising an electrical contact structure located directly on said upper portion of said semiconductor chalcogenide material layer.

10. The semiconductor structure of claim 1, wherein said semiconductor chalcogenide material layer is selected from the group consisting of Ga(S,Se), GaTe, $In_2(S,Se)_3$, InTe, CdTe, Cd(S, Se), ZnTe, Pb(Se,S), Zn(S, Se), $W(S,Se)_2$, $Bi_2S_3$, NiS, ZnO, and $FeS_2$.

11. The semiconductor structure of claim 1, wherein said semiconductor chalcogenide material layer is amorphous.

12. The semiconductor structure of claim 1, wherein said transition metal layer is composed entirely of Mo, and said high work function metal layer is composed entirely of one of Co, Pt or Au.

13. The semiconductor structure of claim 9, wherein said first conductivity type is n-type and said second conductivity type is p-type.

14. A semiconductor structure comprising:
a transition metal layer comprising at least one transition metal element and located on a substrate;
a plurality of conductive elongated nanostructures in contact with a surface of said transition metal layer;
a semiconductor chalcogenide material layer in contact with said plurality of conductive elongated nanostructures, wherein said semiconductor chalcogenide material layer includes a lower portion of a first conductivity type, and an upper portion of a second conductivity type that is different from said first conductivity type, wherein an n-p junction is located at an interface between said lower portion and said upper portion; and
a high work function transition metal element layer comprising at least one elemental metal having a work function greater than 4.6 eV and greater than any work function of said at least one transition metal element, and contacting a surface of said semiconductor chalcogenide material layer and a surface of said transition metal layer, wherein first portions of said plurality of conductive elongated nanostructures are embedded within said high work function transition metal element layer and some of said first portions of said plurality of conductive elongated nanostructures that are embedded in the high work function transition metal element layer directly contact, and stop on, a topmost surface of said transition metal layer, second portions of said plurality of conductive elongated nanostructures are entirely embedded in said lower portion of semiconductor chalcogenide material layer, and said upper portion of said semiconductor chalcogenide material layer and said transition metal layer are devoid of said conductive elongated nanostructures, and wherein an entirety of semiconductor chalcogenide material layer is spaced apart from said transition metal layer by said high work function transition metal element layer, wherein said low work function metal elemental layer is composed entirely of Mo, and said high work function metal layer is composed entirely of one of Co, Pt or Au.

15. A semiconductor structure comprising:
a transition metal layer comprising at least one transition metal element and located on a substrate;
a plurality of conductive elongated nanostructures in contact with a surface of said transition metal layer;
a semiconductor chalcogenide material layer in contact with said plurality of conductive elongated nanostructures, wherein said semiconductor chalcogenide material layer includes a lower portion of a first conductivity type, and an upper portion of a second conductivity type that is different from said first conductivity type, wherein an n-p junction is located at an interface between said lower portion and said upper portion;

a high work function transition metal element layer comprising at least one elemental metal having a work function greater than 4.6 eV and greater than any work function of said at least one transition metal element, and contacting a surface of said semiconductor chalcogenide material layer and a surface of said transition metal layer, wherein first portions of said plurality of conductive elongated nanostructures are embedded within said high work function transition metal element layer and some of said first portions of said plurality of conductive elongated nanostructures that are embedded in the high work function transition metal element layer directly contact, and stop on, a topmost surface of said transition metal layer, second portions of said plurality of conductive elongated nanostructures are entirely embedded in said lower portion of semiconductor chalcogenide material layer, and said upper portion of said semiconductor chalcogenide material layer and said transition metal layer are devoid of said conductive elongated nanostructures, and wherein an entirety of semiconductor chalcogenide material layer is spaced apart from said transition metal layer by said high work function transition metal element layer; and an electrical contact structure located directly on said upper portion of said semiconductor chalcogenide material layer, wherein said first conductivity type is n-type and said second conductivity type is p-type.

* * * * *